United States Patent
Okamoto et al.

(10) Patent No.: US 10,825,790 B2
(45) Date of Patent: Nov. 3, 2020

(54) PROTECTIVE FILM FOR SEMICONDUCTORS, SEMICONDUCTOR DEVICE, AND COMPOSITE SHEET

(71) Applicant: Lintec Corporation, Tokyo (JP)

(72) Inventors: Naoya Okamoto, Tokyo (JP); Ryohei Ikeda, Tokyo (JP); Katsuhiko Horigome, Tokyo (JP)

(73) Assignee: LINTEC Corporation, Tokyo (JP)

( * ) Notice: Subject to any disclaimer, the term of this patent is extended or adjusted under 35 U.S.C. 154(b) by 0 days.

(21) Appl. No.: 15/578,156

(22) PCT Filed: May 31, 2016

(86) PCT No.: PCT/JP2016/065992
§ 371 (c)(1),
(2) Date: Nov. 29, 2017

(87) PCT Pub. No.: WO2016/194893
PCT Pub. Date: Dec. 8, 2016

(65) Prior Publication Data
US 2018/0138141 A1    May 17, 2018

(30) Foreign Application Priority Data
Jun. 4, 2015 (JP) .................. 2015-113907

(51) Int. Cl.
*H01L 23/00* (2006.01)
*H01L 25/10* (2006.01)
(Continued)

(52) U.S. Cl.
CPC ............ *H01L 24/32* (2013.01); *H01L 23/562* (2013.01); *H01L 25/105* (2013.01);
(Continued)

(58) Field of Classification Search
None
See application file for complete search history.

(56) References Cited

U.S. PATENT DOCUMENTS

| 6,025,648 A | 2/2000 | Takahashi et al. |
| 7,227,157 B2 | 6/2007 | Nakatsu |
(Continued)

FOREIGN PATENT DOCUMENTS

| JP | 10-294423 A | 11/1998 |
| JP | 2001-326195 A | 11/2001 |
(Continued)

OTHER PUBLICATIONS

Office Action dated Jun. 28, 2018 in Taiwanese Application No. 105117571.
(Continued)

*Primary Examiner* — Dung A. Le
(74) *Attorney, Agent, or Firm* — Saliwanchik, Lloyd & Eisenschenk

(57) ABSTRACT

[Object] To provide a semiconductor protective film capable of suppressing a warpage of a semiconductor chip without impairing productivity and reliability, a semiconductor device including this, and a composite sheet.
[Solving Means] A semiconductor protective film 10 according to an embodiment of the present invention includes a protective layer 11 formed of a non-conductive inorganic material and an adhesive layer 12 provided on one surface of the protective layer 11. The protective layer 11 includes at least a vitreous material and is typically formed of plate glass. Accordingly, a warpage of a semiconductor element as a protection target can be suppressed effectively.

8 Claims, 6 Drawing Sheets

(51) Int. Cl.
*H01L 23/544* (2006.01)
*H01L 23/31* (2006.01)
*H01L 21/683* (2006.01)
*H01L 21/78* (2006.01)
*H01L 23/498* (2006.01)
*H01L 25/065* (2006.01)

(52) U.S. Cl.
CPC .......... *H01L 21/6836* (2013.01); *H01L 21/78* (2013.01); *H01L 23/3128* (2013.01); *H01L 23/49827* (2013.01); *H01L 23/544* (2013.01); *H01L 24/16* (2013.01); *H01L 24/27* (2013.01); *H01L 24/48* (2013.01); *H01L 24/73* (2013.01); *H01L 24/94* (2013.01); *H01L 25/0657* (2013.01); *H01L 2221/68327* (2013.01); *H01L 2223/54433* (2013.01); *H01L 2223/54486* (2013.01); *H01L 2224/16225* (2013.01); *H01L 2224/16227* (2013.01); *H01L 2224/2919* (2013.01); *H01L 2224/2929* (2013.01); *H01L 2224/29082* (2013.01); *H01L 2224/29188* (2013.01); *H01L 2224/32145* (2013.01); *H01L 2224/32225* (2013.01); *H01L 2224/48091* (2013.01); *H01L 2224/48106* (2013.01); *H01L 2224/48225* (2013.01); *H01L 2224/48227* (2013.01); *H01L 2224/73204* (2013.01); *H01L 2224/73253* (2013.01); *H01L 2224/73265* (2013.01); *H01L 2225/0651* (2013.01); *H01L 2225/06548* (2013.01); *H01L 2225/06562* (2013.01); *H01L 2225/06568* (2013.01); *H01L 2225/06586* (2013.01); *H01L 2225/1023* (2013.01); *H01L 2225/1058* (2013.01); *H01L 2924/00014* (2013.01); *H01L 2924/15311* (2013.01); *H01L 2924/15331* (2013.01); *H01L 2924/181* (2013.01); *H01L 2924/2064* (2013.01); *H01L 2924/20641* (2013.01); *H01L 2924/20642* (2013.01); *H01L 2924/20643* (2013.01); *H01L 2924/3511* (2013.01)

(56) References Cited

U.S. PATENT DOCUMENTS

| | | | |
|---|---|---|---|
| 2005/0236582 A1* | 10/2005 | Nakatsu | C09K 11/778 250/484.4 |
| 2009/0039532 A1 | 2/2009 | Yang et al. | |
| 2010/0193969 A1 | 8/2010 | Takamoto | |
| 2011/0062599 A1* | 3/2011 | Kim | H01L 23/49816 257/778 |
| 2013/0017396 A1 | 1/2013 | Shiga et al. | |
| 2014/0178680 A1 | 6/2014 | Takamoto et al. | |
| 2016/0181567 A1* | 6/2016 | Kim | H01L 51/5246 257/40 |
| 2016/0201200 A1* | 7/2016 | Bruck | C23C 28/044 428/223 |
| 2019/0070884 A1* | 3/2019 | Kobayashi | B41M 7/0081 |

FOREIGN PATENT DOCUMENTS

| | | |
|---|---|---|
| JP | 2002-208571 A | 7/2002 |
| JP | 2010-199542 A | 9/2010 |
| JP | 2012-033626 A | 2/2012 |
| JP | 2013-041965 A | 2/2013 |
| TW | 201306114 A1 | 2/2013 |

OTHER PUBLICATIONS

International Search Report in International Application No. PCT/JP2016/065992, filed May 31, 2016.
Office Action dated Aug. 2, 2019 in Chinese Application No. 201680031690.4.

* cited by examiner

Coplanarity = 214 microns

Coplanarity = 56 microns

PROTECTIVE FILM FOR SEMICONDUCTORS, SEMICONDUCTOR DEVICE, AND COMPOSITE SHEET

CROSS-REFERENCE TO RELATED APPLICATIONS

This application is the U.S. national stage application of International Patent Application No. PCT/JP2016/065992, filed May 31, 2016, which claims priority to Japanese Application No. 2015-113907, filed Jun. 4, 2015, the disclosures of each of which are incorporated herein by reference in their entirety.

TECHNICAL FIELD

The present invention relates to a semiconductor protective film attached to a back surface of a semiconductor element such as a semiconductor chip, for example, a semiconductor device including this and a composite sheet.

BACKGROUND ART

In recent years, semiconductor devices are widely manufactured using a mounting method called a facedown method or flip-chip connection. In such a mounting method, a front surface (active surface) of a semiconductor chip configuring a circuit surface is arranged opposed to a wiring substrate and electrically and mechanically connected to the wiring substrate via a plurality of electrodes called bumps that are formed on the front surface of the semiconductor chip.

For the purpose of protecting the semiconductor chip, a protective firm is attached to a back surface (nonactive surface) of the semiconductor chip mounted by the facedown method in many cases. As such a protective film, there is known a flip-chip type semiconductor back surface film including an adhesive layer and a protective layer laminated on the adhesive layer, the protective layer being formed of a heat-resistant resin or metal (see, for example, Patent Literature 1).

On the other hand, along with miniaturization and high-functionalization of electronic apparatuses in recent years, further miniaturization and high-functionalization of semiconductor devices to be mounted on the electronic apparatuses are demanded. Therefore, developments of a multichip module technology such as PoP (Package on Package) requisite for integration and densification of semiconductor chips are being advanced in various fields.

CITATION LIST

Patent Literature

Patent Literature 1: Japanese Patent Application Laid-open No. 2012-33626

DISCLOSURE OF INVENTION

Technical Problem

For realizing miniaturization and thinning of a semiconductor device, further thinning of a built-in semiconductor chip is necessary. However, as the semiconductor chip becomes thinner, rigidity of the semiconductor chip becomes lower. As a result, a warpage of the semiconductor device due to a heat stress tends to become more prominent.

In this regard, Patent Literature 1 proposes a technology of suppressing a warpage of a package by setting, in an adhesive layer of a protective film to be attached onto a back surface of a semiconductor chip, a content of a heat-curable resin with respect to all resin components to be a predetermined value or less (paragraph [0034] of Patent Literature 1). However, rigidity or an elastic modulus of the adhesive layer formed of a synthetic resin is relatively low, and thus the warpage of a semiconductor device cannot be sufficiently suppressed.

Meanwhile, by forming the protective layer of metal, a relatively-high elastic modulus can be secured. However, the use of a protective film in which the protective layer is formed of metal induces various problems in tetras of productivity and reliability, such as lowering of processing accuracy during dicing processing, an abrasion of a dicing saw (blade), and a short-circuit failure of a semiconductor chip circuit surface due to an attachment of chips. In addition, in a case where characters are printed on the front surface of the adhesive layer by laser or the like, visibility cannot be secured.

In view of the circumstances as described above, the present invention aims at providing a semiconductor protective film capable of suppressing a warpage of a semiconductor chip without impairing productivity and reliability and also securing visibility, a semiconductor device including this, and a composite sheet.

Solution to Problem

For attaining the object described above, a semiconductor protective film according to an embodiment of the present invention includes a protective layer and an adhesive layer.

The protective layer is formed of a non-conductive inorganic material.

The adhesive layer is provided on one surface of the protective layer.

Since the protective layer of the semiconductor protective film is formed of a non-conductive inorganic material, an elastic modulus of the protective layer can be made higher than that in a case where the protective layer is formed of a synthetic resin. Accordingly, it becomes possible to effectively suppress a warpage of a semiconductor element as a protection target. Further, since the protective layer is formed of a non-conductive inorganic material, abrasion and deterioration of a dicing saw can be suppressed while improving processing accuracy during dicing processing as compared to a case where the protective layer is formed of metal. Furthermore, even when chips adhere onto a circuit surface of the semiconductor chip, a short-circuit failure does not occur. Accordingly, productivity and reliability can be improved.

The non-conductive inorganic material forming the protective layer is not limited in particular, and typically, a vitreous material, a ceramic material, a mixture of these, or the like is used. The vitreous material typically includes plate glass, glass fiber, and the like. It should be noted that a glass structure used in the plate glass or glass fiber may either be an amorphous structure or a crystalline structure. Furthermore, by using a material having translucency, such as glass, for the non-conductive inorganic material, visibility can be secured even in a case where characters are printed on a front surface of the adhesive layer by laser or the like.

In a case where the protective layer is formed of plate glass, a thickness thereof can be set to be, for example, 10 μm or more and 300 μm or less. The use of plate glass having such a thickness contributes to thinning of a semiconductor device, and since flexibility of the protective layer is enhanced, handling is facilitated.

A semiconductor device according to an embodiment of the present invention includes a wiring substrate, a semiconductor element, and a protective film.

The semiconductor element is flip-chip mounted on the wiring substrate.

The protective film includes a protective layer formed of a non-conductive inorganic material and an adhesive layer that is provided on one surface of the protective layer and is bonded to a back surface of the semiconductor element.

According to the semiconductor device, since the protective film is provided on the back surface of the semiconductor element, it becomes possible to obtain a semiconductor device having high connection reliability while suppressing a warpage of the semiconductor element.

A print layer may be provided on at least one surface of the protective layer. The print layer typically includes characters, symbols, figures, and the like so as to enable a type of semiconductor element or semiconductor device or the like to be identified. The print layer is typically formed by at least a part of the protective layer or the adhesive layer and is formed on a front surface of the adhesive layer on an adhesion side with respect to the protective layer. The print layer may be formed by cutting the front surface of the protective layer by a laser processing method or the like or may be formed by modifying the front surface of the adhesive layer by irradiating laser light, for example. Particularly in a case where the protective layer is formed of a material having translucency, such as plate glass and transparent ceramics, translucency is provided to the protective layer, so the print layer can easily be formed on the protective layer by laser printing or the like. The protective film may additionally include the print layer. In other words, the print layer may be formed by a layer different from the protective layer and the adhesive layer.

The semiconductor device may further include a semiconductor package component electrically connected to the wiring substrate. In this case, the semiconductor element is arranged between the wiring substrate and the semiconductor package component.

Accordingly, a semiconductor device having a PoP structure or the like with a suppressed warpage can be obtained.

A semiconductor device according to another embodiment of the present invention includes a first wiring substrate, a first semiconductor element, a second semiconductor element, and a second wiring substrate.

The first semiconductor element is flip-chip mounted on the first wiring substrate.

The second wiring substrate is arranged between the first semiconductor element and the second semiconductor element. The second wiring substrate includes a protective layer, a wiring layer, and an adhesive layer. The protective layer is formed of a non-conductive inorganic material. The wiring layer is provided on the protective layer and electrically connects the first wiring substrate and the second semiconductor element. The adhesive layer is provided on one surface of the protective layer and is bonded to a back surface of the first semiconductor element.

In the semiconductor device, the second wiring substrate includes the protective layer formed of a non-conductive inorganic material and is bonded to the back surface of the first semiconductor element via the adhesive layer. Accordingly, a semiconductor device having high connection reliability, in which a warpage of the first semiconductor chip is suppressed, can be obtained.

Furthermore, a composite sheet according to an embodiment of the present invention includes a cohesive sheet formed by laminating a cohesive layer on one surface side of a base layer and a protective film laminated on the cohesive layer side of the cohesive sheet.

The protective film includes a protective layer formed of a non-conductive inorganic material and an adhesive layer provided on a surface of the protective layer on the other side of the cohesive layer side.

Advantageous Effects of Invention

According to the present invention, a warpage of a semiconductor chip can be suppressed without impairing productivity and reliability.

MODES FOR CARRYING OUT THE INVENTION

Hereinafter, embodiments of the present invention will be described with reference to the drawings.

First Embodiment

Figure 1:
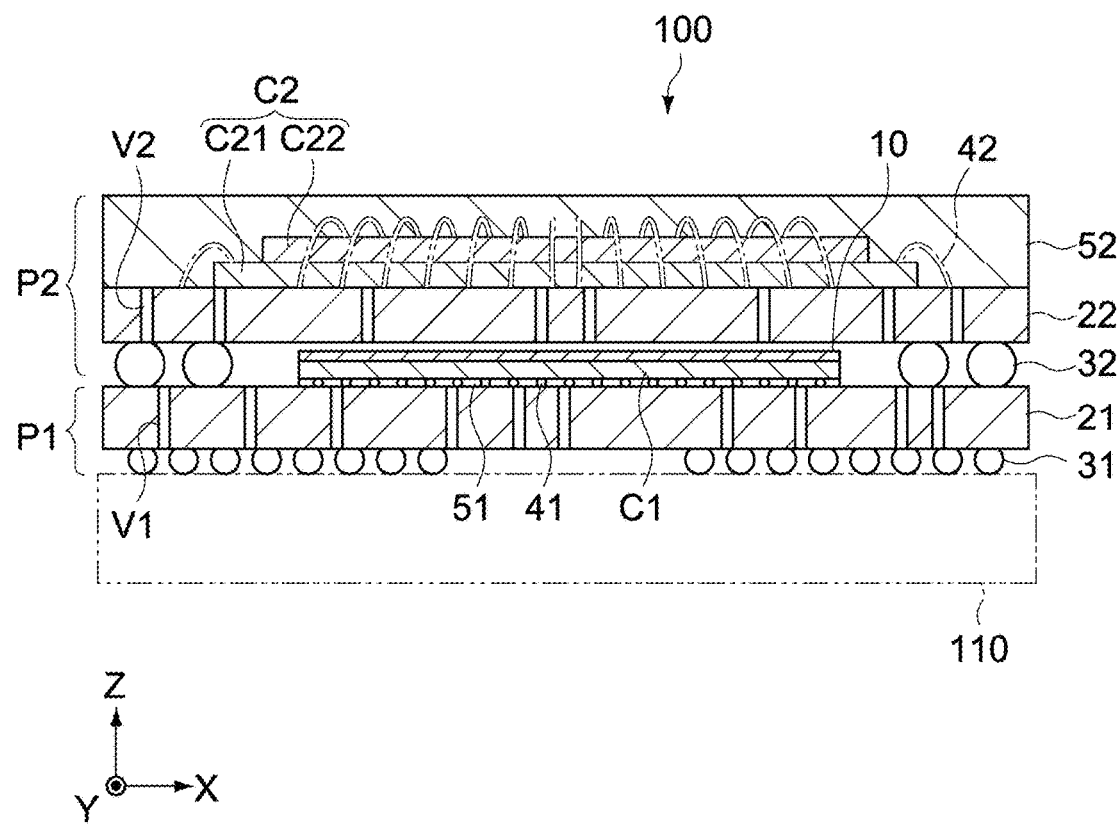
FIG. 1 A schematic side cross-sectional diagram showing a configuration of a semiconductor device according to a first embodiment of the present invention.
Figure 2:
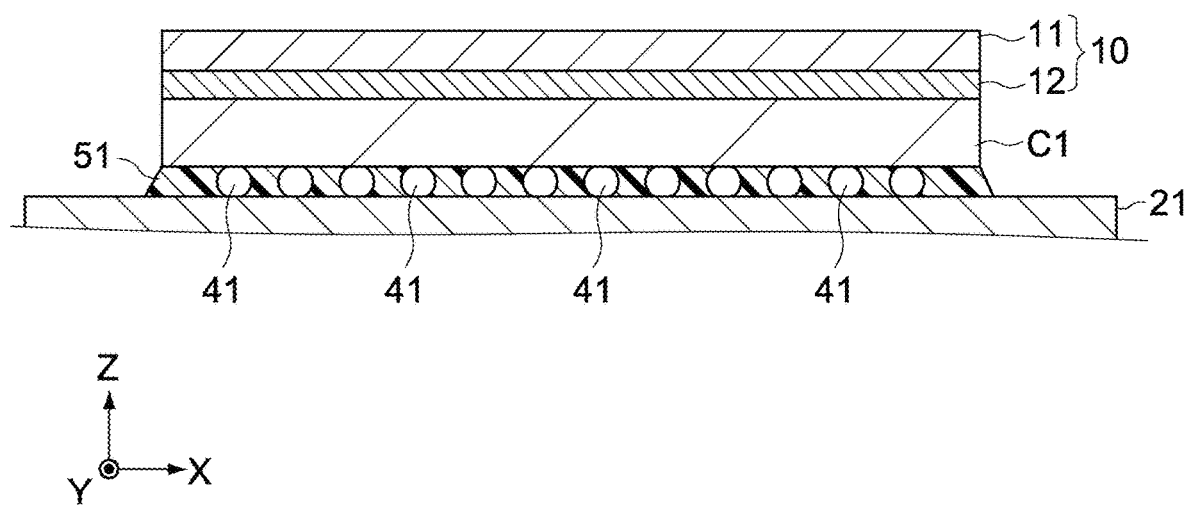
FIG. 2 An enlarged diagram showing a main portion of FIG. 1.

FIG. 1 is a schematic side cross-sectional diagram showing a configuration of a semiconductor device 100 according to an embodiment of the present invention. FIG. 2 is an enlarged diagram showing a main portion (first semiconductor package P1) of FIG. 1.

In the respective figures, X, Y, and Z axes represent 3 axial directions orthogonal to one another, and the Z-axis direction corresponds to a height direction (thickness direction) of the semiconductor device 100.

Semiconductor Device

As shown in FIG. 1, the semiconductor device 100 of this embodiment includes a laminated structure (PoP: Package on Package) constituted of a first semiconductor package P1 and a second semiconductor package P2.

The first semiconductor package P1 includes a first wiring substrate 21 and a first semiconductor chip C1 flip-chip mounted (flip-chip connected) on the first wiring substrate 21.

The second semiconductor package P2 is mounted on the first semiconductor package P1. The second semiconductor package P2 includes a second wiring substrate 22 and a second semiconductor chip C2 wire-bonded onto the second wiring substrate 22. The second semiconductor chip C2 includes a laminated structure constituted of two semiconductor chips C21 and C22 of different sizes.

The first semiconductor chip C1 and the second semiconductor chip C2 (C21, C22) are each typically constituted of a monocrystalline silicon (Si) substrate, and a circuit surface on which a plurality of circuit elements such as a transistor and a memory are integrated is formed on front surfaces thereof.

The first semiconductor chip C1 is mounted on an upper surface of the first wiring substrate 21 by a facedown method so that the circuit surface thereof faces the first wiring substrate 21. The first semiconductor chip C1 is electrically and mechanically connected to the first wiring substrate 21 via a plurality of bumps (protrusion electrodes) 41 formed on the circuit surface thereof (lower surface in figure). A reflow soldering method that uses a reflow furnace, for example, is used for bonding the first semiconductor chip C1 onto the first wiring substrate 21.

An underfill resin layer 51 is typically provided between the first semiconductor chip C1 and the first wiring substrate 21. The underfill resin layer 51 is provided for sealing the circuit surface and bumps 41 of the first semiconductor chip C1 to block them from ambient air and also enhancing a bonding intensity between the first semiconductor chip C1 and the first wiring substrate 21 to secure connection reliability of the bumps 41.

A semiconductor protective film (hereinafter, referred to as protective film) 10 for protecting the first semiconductor chip C1 is attached to a back surface of the first semiconductor chip C1 (surface on other side of circuit surface, i.e., upper surface in figure). The protective film 10 includes a function of suppressing a warpage of the first semiconductor chip C1 and the first semiconductor package P1 as will be described later.

Meanwhile, the second semiconductor chip C2 (C21, C22) is mounted on an upper surface of the second wiring substrate 22 by a face-up method so that back surfaces thereof on the other side of the respective circuit surfaces face the second wiring substrate 22. The second semiconductor chip C2 (C21, C22) includes a plurality of electrode pads (not shown) respectively arranged in a periphery of the circuit surfaces (upper surface in figure) and is electrically connected to the second wiring substrate 22 via a plurality of bonding wires 42 respectively connected to the electrode pads. In this case, the second wiring substrate 22, the semiconductor chip C21, and the two semiconductor chips C21 and C22 are bonded to one another by a non-conductive adhesive or the like.

A sealing layer 52 that seals the second semiconductor chip C2 (C21, C22) and the bonding wires 42 is provided on the upper surface of the second wiring substrate 22. Similar to the underfill resin layer 51, the sealing layer 52 is provided for blocking the circuit surfaces of the second semiconductor chip C2 (C21, C22) from ambient air and enhancing connection reliability between the second semiconductor chip C2 (C21, C22) and the second wiring substrate 22.

The first wiring substrate 21 and the second wiring substrate 22 may be formed of the same type of materials or may be formed of different types of materials. The first wiring substrate 21 and the second wiring substrate 22 are typically constituted of an organic wiring substrate such as a glass epoxy substrate and a polyimide substrate, but are not limited thereto, and a ceramic substrate or a metal substrate may also be used. The type of wiring substrate is not limited in particular, and various substrates such as a single-sided substrate, a double-sided substrate, a multilayer substrate, and an element-incorporated substrate are applicable. In this embodiment, the first and second wiring substrates 21 and 22 are constituted of glass epoxy-based multilayer wiring substrates respectively including via holes V1 and V2.

On the back surface (lower surface in figure) of the first wiring substrate 21, a plurality of external connection terminals 31 that are connected to a control substrate 110 called motherboard or the like are provided. Specifically, the first wiring substrate 21 is configured as an interposer substrate (daughterboard) interposed between the first semiconductor chip C1 and the control substrate 110 and also includes a function as a re-wiring layer that converts arrangement intervals of bumps 51 on the circuit surface of the first semiconductor chip C1 into land pitches of the control substrate 110.

On the back surface (lower surface in figure) of the second wiring substrate 22, a plurality of bumps 32 that are connected to the front surface of the first wiring substrate 21 are provided. Specifically, the second wiring substrate 22 is configured as an interposer substrate that connects the second semiconductor chip C2 (C21, C22) to the first wiring substrate and is electrically connected to the control substrate 110 via the first wiring substrate 21 and the external connection terminals 31.

The external connection terminals 31 and the bumps 41 and 32 are typically constituted of solder bumps (ball bumps) but are not limited thereto, and other protrusion electrodes such as plated bumps and stud humps may also be used. A reflow soldering method is used for the connection of the second wiring substrate 22 with respect to the first wiring substrate 21 and the connection of the semiconductor device 100 with respect to the control substrate 110.

Here, a warpage deformation of the semiconductor chip or semiconductor device in the reflow mounting causes a failure, mounting defect, lowering of reliability of an electronic apparatus and has therefore become one of important problems. In the case of the semiconductor device 100 including a PoP structure as shown in FIG. 1, for example, a warpage is apt to occur since the first and second semiconductor packages P1 and P2 have single-sided sealing structures. Particularly because the first semiconductor package P1 positioned on a lower side is thinner than the second semiconductor package P2 positioned on an upper side, a sealing area is partial, and the like, a warpage is more apt to occur in the first semiconductor package P1 than the second semiconductor package P2. If the first semiconductor package P1 is largely warped during solder reflow, the bumps 32 of the second semiconductor package P2 are set apart from the first wiring substrate 21, and thus a connection failure may be caused.

For eliminating such a problem, in the semiconductor device 100 of this embodiment, a function of suppressing a warpage of the first semiconductor package P1 is provided to the protective film 10 attached to the back surface of the first semiconductor chip C1. Hereinafter, the protective film 10 will be described in detail.

Configuration of Protective Film

Figure 3:
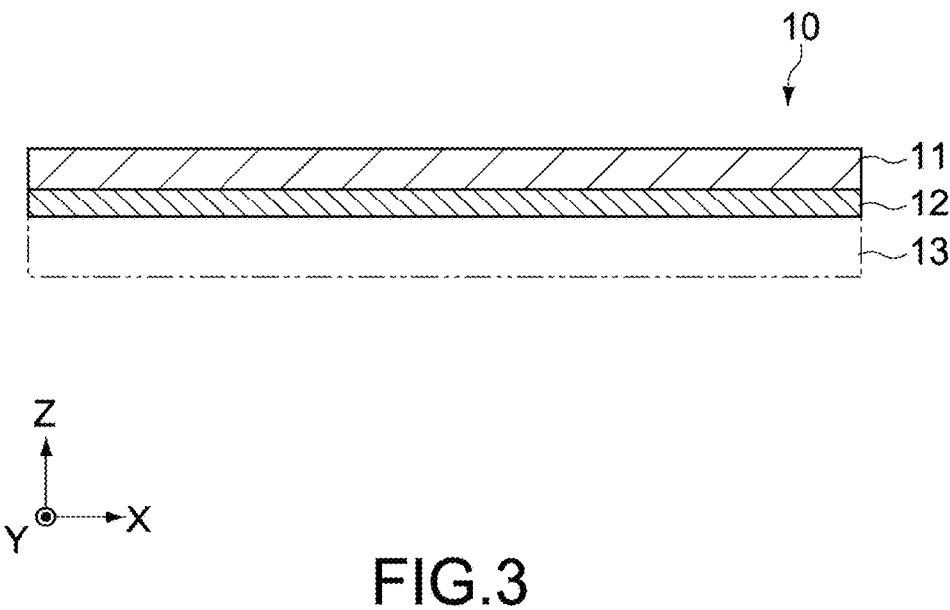
FIG. 3 A schematic side cross-sectional diagram showing a protective film according to an embodiment of the present invention.

FIG. 3 is a schematic side cross-sectional diagram showing the protective film 10 according to the embodiment of the present invention.

The protective film 10 is provided on the back surface of the first semiconductor chip C1. By being provided on the back surface of the first semiconductor chip C1, the protective film 10 exerts various functions such as an improvement of rigidity of the first semiconductor chip C1, protection of the back surface of the first semiconductor chip C1, display of a type of the first semiconductor chip C1, and suppression of a warpage of the first semiconductor package P1. The protective film 10 is typically attached to a back surface of a semiconductor wafer after back grind (back surface grinding) processing but before dicing processing as will be described later.

As shown in FIG. 2, the protective film 10 of this embodiment includes a laminated structure constituted of a protective layer 11 and an adhesive layer 12. As shown in FIG. 2, the protective film 10 is attached to the back surface of the first semiconductor chip C1 via the adhesive layer 12. It should be noted that the protective film 10 is formed by cutting out a wafer-size protective film 10F (see FIG. 6(A)) attached to a back surface of a semiconductor wafer used in producing the first semiconductor chip C1 in a chip level. It should also be noted that the protective film according to the present invention can of course be used as a semiconductor protective film for devices other than the semiconductor device shown in FIG. 1.

Protective Layer

The protective layer 11 is configured as a substrate of the protective film 10. The protective layer 11 is formed of a non-conductive inorganic material. The non-conductive inorganic material is not limited in particular as long as it is suited for work processing, for example, dicing of a semiconductor wafer, and typically, a vitreous material, a ceramic material, a mixture of these, or the like is used.

The vitreous material typically includes plate glass, glass fiber, and the like. A glass structure used in the plate glass or glass fiber may either be an amorphous structure or a crystalline structure. The glass type is not limited in particular, and soda-lime glass, lead glass, borosilicate glass, quartz glass, or the like is typically used. As the plate glass, for example, a thin plate glass for display, particularly a flexible roll-type ultrathin plate glass that can be wound up is favorable. As the glass fiber, for example, a glass fiber configured as fiberglass paper (glass paper) or a battery material (separator) is applicable.

Since the protective layer 11 of the protective film 10 according to this embodiment is formed of a non-conductive inorganic material, an elastic modulus of the protective layer 11 can be made higher than that in a case where the protective layer 11 is formed of a synthetic resin.

Figure 4A:
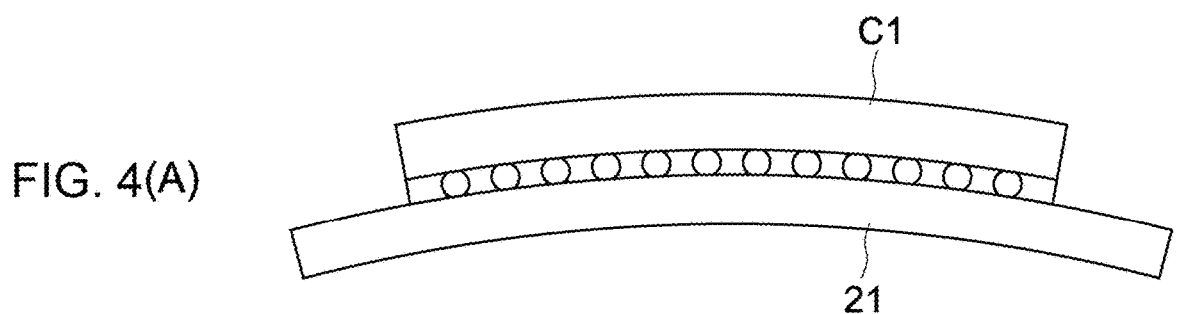
FIGS. 4A and 4B Schematic diagrams showing a slightly-emphasized state of a warpage of a semiconductor package not including a protective film.
Figure 4B:
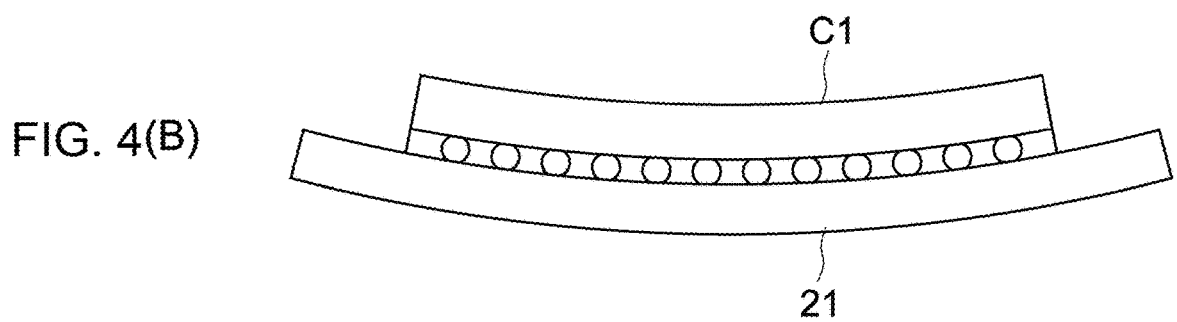

Typically, the elastic modulus of the protective layer 11 is not limited in particular as long as a warpage of the first semiconductor package P1 during reflow mounting can be suppressed. The warpage of the first semiconductor package P1 is mainly due to a mismatch between a linear expansion coefficient of the first semiconductor chip C1 and a linear expansion coefficient of the first wiring substrate 21, and a larger warpage is induced as a difference between the two linear expansion coefficients becomes larger. A warpage direction differs depending on the material type, characteristics, and the like, but the direction during heating tends to become opposite to that during cooling. FIG. 4 are schematic diagrams showing a slightly-emphasized state of a warpage of a semiconductor package not including the protective film. (A) shows a state at room temperature, and (B) shows a state at high temperature. Therefore, it is favorable to set the elastic modulus of the protective layer 11 such that the warpage of the first semiconductor package P1 in both directions can be suppressed.

In this embodiment, the first semiconductor chip C1 is constituted of a silicon substrate, and the first wiring substrate 21 is formed of a glass epoxy-based organic material as described above. The linear expansion coefficient of the first semiconductor chip C1 ($\sim 10^{-6}/°$ C.) and the linear expansion coefficient of the first wiring substrate 21 ($\sim 10^{-5}/°$ C.) differ by about one digit, and a thermal expansion (thermal contraction) of the first wiring substrate 21 is larger than that of the first semiconductor chip C1. The linear expansion coefficient of the protective layer 11 may be set using the linear expansion coefficient of the first wiring substrate 21 as a reference or may be set using the linear expansion coefficient of the first semiconductor chip C1 as a reference.

For example, by causing the linear expansion coefficient of the protective layer 11 to coincide with the linear expansion coefficient of the first wiring substrate 21 or causing it to become smaller than the linear expansion coefficient of the first wiring substrate 21, it becomes possible to suppress a deformation of the first semiconductor chip C1 interposed between the first wiring substrate 21 and the protective film 10. Further, by causing the linear expansion coefficient of the protective layer 11 to coincide with the linear expansion coefficient of the first semiconductor chip C1 or causing it to become smaller than the linear expansion coefficient of the first semiconductor chip C1, it becomes possible to enhance rigidity of the first semiconductor chip C1 and suppress a deformation of the first semiconductor chip C1 due to the heat stress. Furthermore, the linear expansion coefficient of the protective layer 11 may be set to an appropriate value between the linear expansion coefficient of the first wiring substrate 21 and the linear expansion coefficient of the first semiconductor chip C1.

By setting the linear expansion coefficient of the protective layer 11 in this way, it becomes possible to effectively suppress a warpage of the first semiconductor package P1. The non-conductive inorganic material forming the protective layer 11 only needs to be selected from materials with which a desired linear expansion coefficient can be obtained. A plurality of types of non-conductive inorganic materials may be combined so as to obtain a desired linear expansion coefficient.

In this embodiment, the protective layer 11 is formed of a vitreous material, more specifically, plate glass. By forming the protective layer 11 of plate glass, a handling property of the protective film 10 is enhanced, and productivity can be improved. A so-called reinforced Mass material or a normal glass material may either be used as the plate glass. A rigid glass sheet or a flexible glass film may either be used as the plate glass. While a material having optical transparency is used as the plate glass, a colored material may also be used.

The linear expansion coefficient of the protective layer 11 can be selected or adjusted on the basis of components, processing method, and the like of the plate glass forming the protective layer 11. The plate glass forming the protective layer 11 can typically be selected from those having linear expansion coefficients of $10^{-5}$ to $10^{-7}/°$ C. order.

A softening point (Tg) of the vitreous material forming the protective layer 11 is favorably a temperature higher than a reflow temperature (e.g., 260° C. or more). Accordingly, it becomes possible to suppress softening and deformation of the protective layer 11 during reflow mounting and maintain an effect of suppressing a warpage of the first semiconductor chip C1.

Further, the thickness of the protective layer 11 can be set as appropriate in accordance with the size (thickness, size) of the first semiconductor chip C1, the size (thickness, size) of the first semiconductor package P1, a gap between the first semiconductor package P1 and the second semiconductor package P2, and the like. In this embodiment, flexible plate glass having a thickness of, for example, 10 μm or more and 300 μm or less, favorably 50 μm or more and 200 μm or less is used as the protective layer 11. Accordingly, it becomes possible to effectively prevent a warpage deformation of the first semiconductor package P1 while securing thinning of the first semiconductor package P1.

Further, since the protective layer 11 has flexibility, the protective film 10 can be wound up in a roll so as to enhance a handling property, a storage property, a transportation property, and the like. Moreover, due to less deformations such as a curl when wound off from the roll, the flexible glass film is advantageous in its excellent handling property.

A commercially-available material or a material optimized according to purposes may be used for the plate glass as described above. An example of the commercially-available material is alkali-free ultrathin plate glass "G-Leaf" (registered trademark) available from Nippon Electric Glass Co., Ltd., or the like.

Adhesive Layer

The adhesive layer 12 is provided on one surface of the protective layer 11. The adhesive layer 12 is typically formed of at least one type of a heat-curable component and an energy ray-curable component and a binder polymer component.

Examples of the heat-curable component include an epoxy resin, a phenol resin, a melamine resin, a urea resin, a polyester resin, a urethane resin, an acrylic resin, a polyimide resin, a benzoxazine resin, and a mixture of these. Particularly in this embodiment, an epoxy resin, a phenol resin, and a mixture of these are favorably used.

Of these, in this embodiment, a bisphenol-based glycidyl-type epoxy resin, an o-crezol novolac-type epoxy resin, and a phenol novolac-type epoxy resin are favorably used. Regarding these epoxy resins, one type may be used independently, or two or more types may be used in combination.

The energy ray-curable component is constituted of a compound that is polymerized and cured when irradiated with energy rays such as ultraviolet rays and electron rays. This compound includes at least one polymerizable double bond in a molecule and usually has a molecular weight of about 100 to 30,000, favorably about 300 to 10,000. Examples of such an energy ray polymerization-type compound include trimethylolpropane triacrylate, tetramethylolmethane tetraacrylate, pentaerythritol triacrylate, dipentaerythritol monohydroxypentaacrylate, dipentaerythritol hexaacrylate, 1,4-butylene glycol diacrylate, 1,6-hexanediol diacrylate, polyethylene glycol diacrylate, oligoester acrylate, polyester-type or polyether-type urethane acrylate oligomer, polyester acrylate, polyether acrylate, and epoxy modified acrylate.

Of these, in this embodiment, an ultraviolet-curable resin is favorably used, specifically, oligoester acrylate, urethane acrylate oligomer, and the like are used particularly favorably. By mixing a photopolymerization initiator into the energy ray-curable component, a polymerization curing time and a light irradiation amount can be reduced.

The binder polymer component is used for giving a moderate tack to the protective layer 11 and improving sheet operability. A weight average molecular weight of the binder polymer is usually within the range of 50,000 to 2,000,000, favorably 100,000 to 1500,000, particularly favorably 200,000 to 1000,000. If the molecular weight is too low, sheet formation becomes insufficient, and if it is too high, compatibility with other components becomes poor, with the result that uniform sheet formation is hindered.

As such a binder polymer, for example, an acrylic polymer, a polyester resin, a urethane resin, a silicone resin, a rubber polymer, or the like is used, and an acrylic polymer is used particularly favorably.

An example of the acrylic polymer is a (meth) acrylic acid ester copolymer constituted of a (meth) acrylic acid ester monomer and a constituent unit derived from a (meth) acrylic acid derivative. Here, the (meth) acrylic acid ester monomer is preferably a (meth) acrylic acid alkyl ester in which a carbon number of an alkyl group is 1 to 18, such as methyl (meth) acrylate, ethyl (meth) acrylate, propyl (meth) acrylate, and butyl (meth) acrylate. Examples of the (meth) acrylic acid derivative include (meth) acrylic acid, glycidyl (meth) acrylate, and hydroxyethyl (meth) acrylate.

By introducing a glycidyl group into an acrylic polymer by copolymerizing glycidyl methacrylate and the like, compatibility with an epoxy resin as a heat-curable adhesive component is improved, Tg obtained after curing is increased, and heat resistance is also improved. Further, by introducing a hydroxyl group into acrylic polymer with hydroxyethyl acrylate or the like, it becomes easy to control adhesiveness with respect to a chip and a cohesive physical property.

Further, the adhesive layer 12 may be colored. Coloring of the adhesive layer 12 is carried out by, for example, adding a pigment, a dye, or the like. When the adhesive layer 12 is colored, an external appearance is improved, and visibility and distinguishability thereof can be enhanced when laser printing is performed. The color of the adhesive layer 12 is not limited in particular, and it may either be an achromatic color or a chromatic color. In this embodiment, the adhesive layer 12 is colored in black.

Further, a coupling agent may be added to the adhesive layer 12 for the purpose of improving adhesiveness/adhesion between the protective film 10 and the back surface of the chip after curing. The coupling agent can improve adhesiveness and adhesion without impairing the heat resistance of the protective film 10, and further, water resistance (moisture and heat resistance) is also improved.

For such an adhesive layer 12, a commercially-available material may be used, or a material optimized according to purposes may be used. As the commercially-available material, for example, a chip back-surface protective tape "LC tape" series manufactured by LINTEC Corporation (e.g., LC2841, LC2824H, LC2826H, LC2850) is favorably used.

Release Sheet

As shown in FIG. 3, the protective film 10 of this embodiment further includes a release sheet 13. The release sheet 13 is provided so as to cover the adhesive layer 12 and is peeled off from the adhesive layer 12 when the protective film 10 is used.

As the release sheet 13, for example, a polyethylene film, a polypropylene film, a polybutene film, a polybutadiene film, a polymethylpentene film, a polyvinyl chloride film, a vinyl chloride copolymer film, a polyethylene terephthalate film, a polyethylene naphthalate film, a polybutylene terephthalate film, a polyurethane film, an ethylene vinyl acetate film, an ionomer resin film, an ethylene-(meth) acrylic acid copolymer film, an ethylene-(meth) acrylate copolymer film, a polystyrene film, a polycarbonate film, a polyimide film, a fluororesin film, or the like is used. Moreover, a crosslinked film of these is also used. Further, a laminated film of these may also be used.

Further, a surface tension of the release sheet 1 is favorably 40 mN/m or less, more favorably 37 mN/m or less, particularly favorably 35 mN/m or less. The release sheet 13 having a low surface tension as described above can be obtained by appropriately selecting a material or by carrying out release processing by applying a silicone resin or the like onto the front surface of the release sheet 13.

The thickness of the release sheet 13 is normally about 5 to 300 μm, favorably about 10 to 200 μm, particularly favorably about 20 to 150 μm.

For such a release sheet 13, a commercially-available material may be used, or a material optimized according to purposes may be used. As the commercially-available material, for example, a release film "D-645H" manufactured by LINTEC Corporation, or the like is favorably used.

Print Layer

A print layer may be provided on at least one surface of the protective layer 11. Typically, the print layer includes characters, symbols, figures, and the like, and distinguishably displays the type of the semiconductor element or the semiconductor device, and the like. The print layer is typically constituted of at least a part of the protective layer 11 or the adhesive layer 12 and is formed on the front surface of the adhesive layer 12 on the adhesion side with respect to the protective layer 11, for example. The print layer may be formed by, for example, scraping the front surface of the protective layer 11 by a laser processing method or the like or modifying the front surface of the adhesive layer 2 by laser light irradiation. Particularly in a case where the protective layer 11 is formed of a material having translucency, such as plate glass and transparent ceramics, translucency is imparted to the protective layer 11, so it is possible to easily form a print layer on the front surface of the adhesive layer 12 from above the protective layer by laser printing or the like. The protective film 10 may additionally include the print layer. In other words, the print layer may be constituted of a layer different from the protective layer 11 and the adhesive layer 12.

Figure 5A:
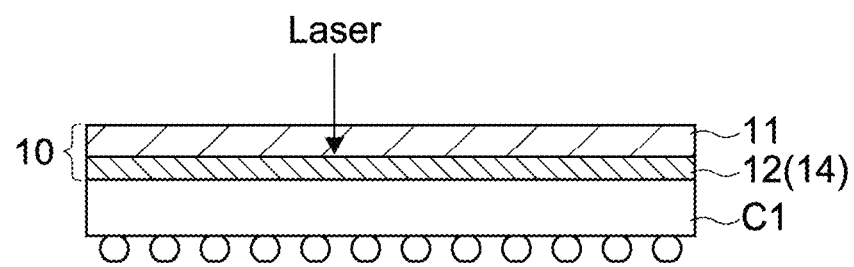
FIGS. 5A through 5C Schematic side cross-sectional diagrams each showing a configuration example of the semiconductor device to which a protective film including a print layer is attached.
Figure 5B:
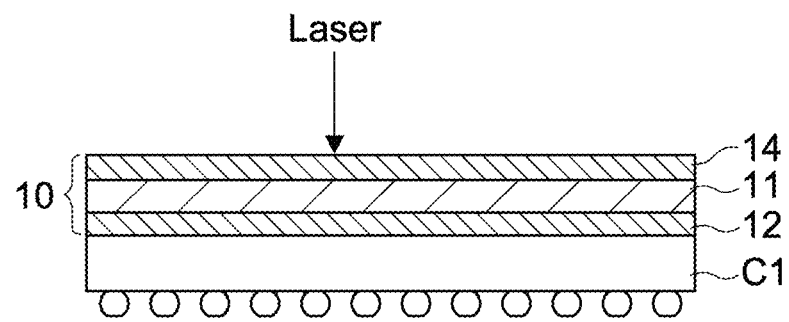
Figure 5C:
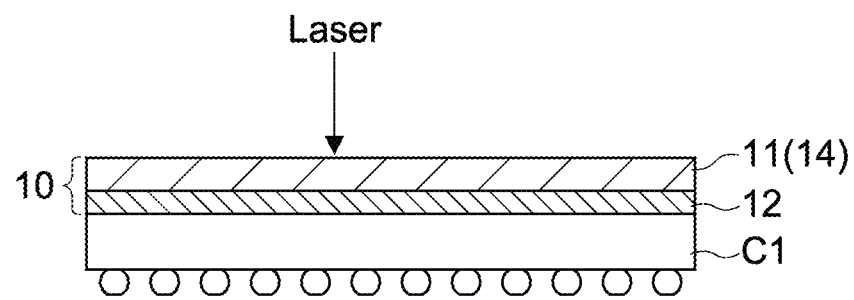

FIGS. 5(A) to 5(C) are schematic side cross-sectional diagrams each showing a configuration example of the semiconductor device to which the protective film 10 including the print layer is attached.

FIG. 5(A) shows an example where a print layer 14 is provided on the lower surface (adhesive layer 12) of the protective layer 11. In this case, the print layer 14 is constituted of at least a part of the adhesive layer 12 and is formed by irradiating infrared laser (laser marking) onto the adhesive layer 12 from above the protective layer 11. Since the protective layer 11 is formed of a vitreous material having translucency, infrared laser can easily reach the adhesive layer 12 via the protective layer 11. In this example, the print layer 14 is formed at an interface between the protective layer 11 and the adhesive layer 12 (adhesion-side front surface of adhesive layer 12 with respect to protective layer 11) and includes characters, symbols, or figures recognizable via the protective layer 11. The print layer 14 typically displays the type of the semiconductor chip or semiconductor device, or the like.

FIG. 5(B) shows an example where the print layer 14 is provided on the upper surface of the protective layer 11. In this example, the print layer 14 may be formed of the same material as the adhesive layer 12 or formed of a material different from that of the adhesive layer 12. Further, since the print layer 14 is provided on the upper surface of the protective layer 11 in this example, the protective layer 11 may be a layer that does not transmit infrared rays. In FIGS. 5(A) and 5(B), laser marking on the print layer 14 may be carried out before the adhesive layer 12 is cured, or may be performed after the adhesive layer 12 is cured.

FIG. 5(C) shows an example where the print layer 14 is provided on at least a part of the protective layer 11. In a case where the protective layer 11 is formed of a non-conductive inorganic material having translucency, such as a vitreous material, it is possible to perform laser processing or surface processing using a micro-cutter. Specifically, for example, printing information may be written on the front surface of the protective layer 11 using laser light with which the protective layer 11 can be processed (absorbable by vitreous material). In the print layer 14 formed in this way, it is possible to make the printing information emerge on the front surface of the protective layer 11 by viewing the protective layer 11 from the front or in a diagonal direction.

Method of Producing Semiconductor Device

Next, a method of producing a semiconductor device including the protective film 10, particularly the first semiconductor package P1, will be described.

FIGS. 6(A) to 6(E) are schematic cross-sectional process diagrams for explaining the method of producing the first semiconductor package P1.

Figure 6A:
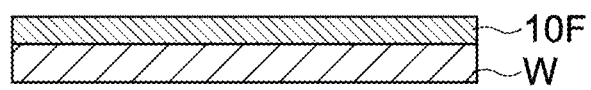
FIGS. 6A through 6E Schematic cross-sectional process diagrams for explaining a method of producing a first semiconductor package in the semiconductor device.

First, as shown in FIG. 6(A), a protective film 10F is attached onto a back surface of a semiconductor wafer W (upper surface in figure) thinned to a predetermined thickness (e.g., 50 μm) by a back grind process. For example, the protective film 10F is formed to have substantially the same size and shape as the semiconductor wafer W and is attached to the back surface of the semiconductor wafer W via the adhesive layer 12. The release sheet 13 (see FIG. 3) of the protective film 10 is peeled off from the adhesive layer 12 before the protective film is bonded to the semiconductor wafer W. The adhesive layer 12 is then cured by heat processing or energy ray irradiation processing.

By attaching the protective film 10F to the semiconductor wafer W, the thickness of the semiconductor wafer W in terms of appearance is increased, with the result that rigidity of the semiconductor wafer W is enhanced, and a handling property and dicing suitability are improved. Accordingly, the semiconductor wafer W is effectively protected from damages, cracks, and the like.

Next, the print layer 14 (FIG. 5 (A)) that displays product information is formed on the protective film 10F. The print layer 14 is formed by irradiating infrared laser onto the adhesive layer 12 via the protective layer 11 (laser marking). By forming the print layer 14 at a wafer level, it is possible to efficiently print predetermined product information in individual chip areas.

Figure 6B:
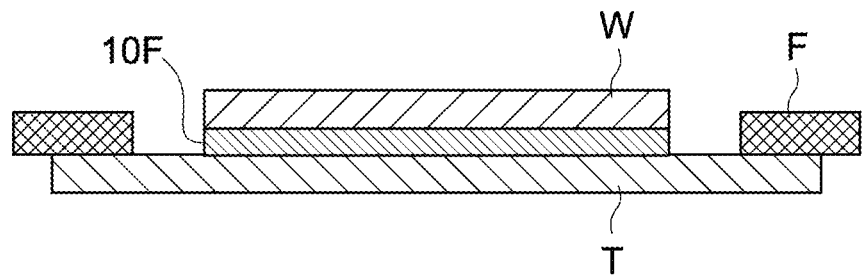

Subsequently, as shown in FIG. 6(B), the semiconductor wafer W onto which the protective film 10F is adhered is mounted on a cohesive surface of a dicing tape T. The dicing tape T is arranged on a dicing table (not shown) while the cohesive surface provided on one surface thereof faces upward and is fixed by a ring frame F. The semiconductor wafer W is fixed onto the dicing tape T via the protective film 10F with its circuit surface facing upward.

Figure 6C:
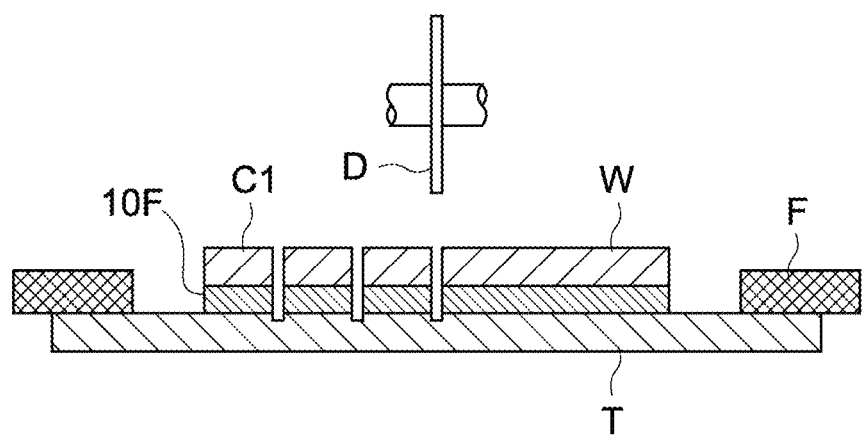

Then, as shown in FIG. 6(C), the semiconductor wafer W is diced for each circuit (in chip unit) by a dicer D. At this time, a blade of the dicer D cuts the semiconductor wafer W to a depth that reaches the upper surface (cohesive surface) of the dicing tape T. Accordingly, the protective film 10F is cut into chip units together with the semiconductor wafer W, and thus a protective film 10 corresponding to each semiconductor chip C1 is formed.

Figure 6D:
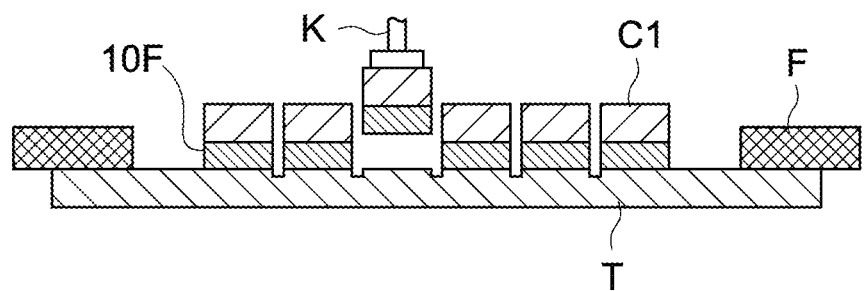
Figure 6E:
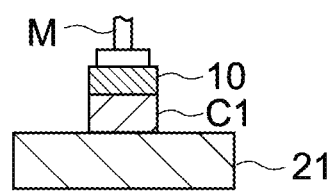

Subsequently, as shown in FIG. 6(D), the semiconductor chip C1 is separated from the cohesive layer of the dicing tape T together with the protective film 10 by a collet K. After that, a flux is adhered onto the circuit surface (bumps) of the semiconductor chip C1, and the semiconductor chip (first semiconductor chip) C1 is flip-chip mounted on the wiring substrate (first wiring substrate) 21 using a mounter M as shown in FIG. 6(E).

According to this embodiment, since the protective film 10 is adhered onto the back surface of the semiconductor chip C1, the rigidity of the semiconductor chip C1 in terms of appearance is enhanced. Accordingly, dicing suitability is improved, and it is possible to prevent the chip from cracking due to a stress that acts in the pickup process from the dicing tape, the mounting process onto the wiring substrate, and the like.

Further, since the protective layer 11 is formed of a vitreous material (non-conductive inorganic material), it is possible to suppress abrasion and deterioration of the dicing saw (blade) while improving processing accuracy in the dicing processing as compared to the case where the protective layer 11 is formed of metal. Further, even if chips adhere onto the circuit surface of the semiconductor chip C1, a short-circuit failure does not occur. As a result, productivity and reliability can be improved.

Furthermore, according to this embodiment, since the protective layer 11 is formed of a vitreous material, the warpage of the semiconductor chip C1 in the reflow mounting process of the semiconductor chip C1 on the wiring substrate 21 can be suppressed.

Figure 7A:
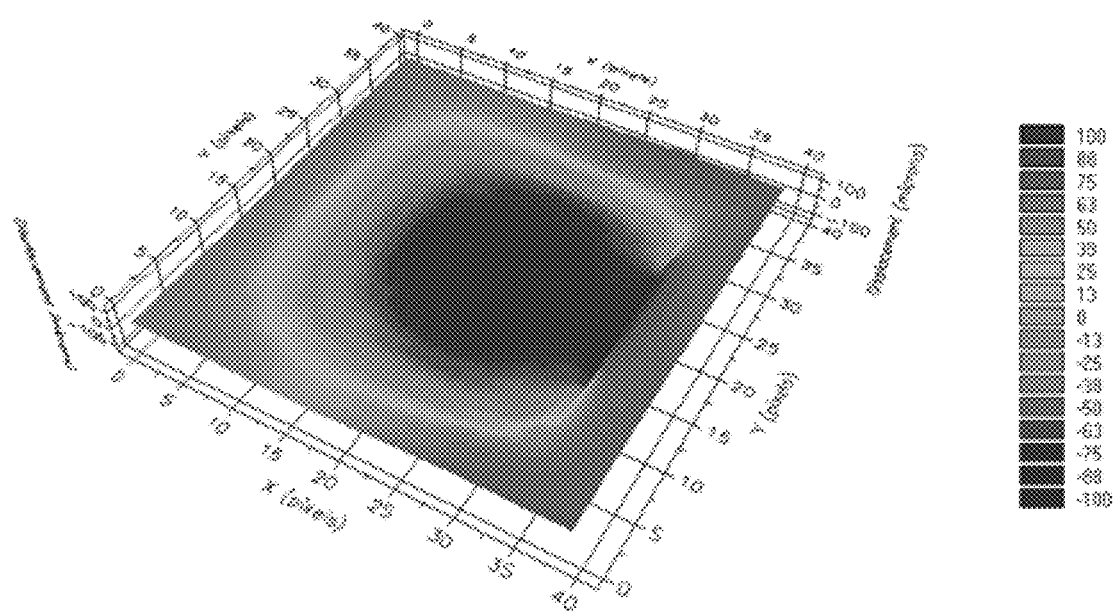
FIGS. 7A and 7B Diagrams showing an evaluation result of a coplanarity of semiconductor chips to which protective films having different configurations are respectively attached.
Figure 7B:
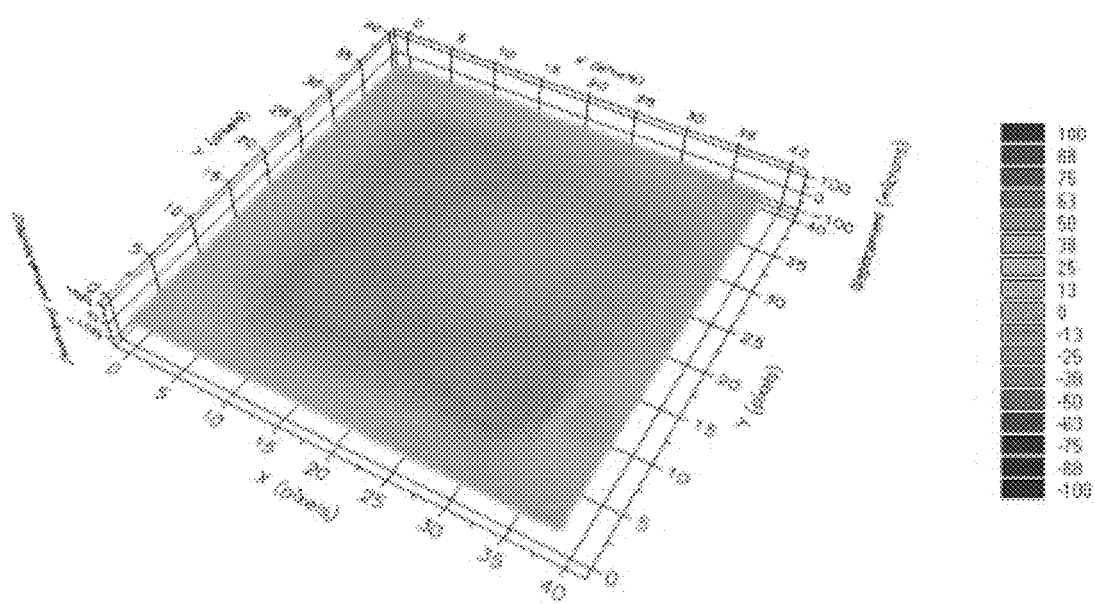

FIGS. 7(A) and 7(B) show evaluation results of coplanarity of semiconductor chips to which two protective films having different configurations are respectively attached. The thickness of the silicon semiconductor chip used for the evaluation was 50 µm and the size thereof was 10 mm*10 mm, and a warpage amount of an upper surface of the chip after reflow mounting with respect to a glass epoxy-based wiring substrate (upper surface of protective film) was evaluated.

As reflow conditions, an IR reflow in which a preheating temperature is 130° C., a heating temperature (maximum temperature) is 260° C., and a heating time (holding time at heating temperature) is 1 minute was carried out 3 times. For a reflow furnace, "WL-15-20 DNX type" manufactured by Sagami-Rikou Co., Ltd. was used. In addition, "TherMoire PS200e" manufactured by Akrometrix, LLC was used as a device for evaluating coplanarity.

In the sample shown in FIG. 7(A), a 25-µm thick protective tape "LC2850" (hereinafter, referred to as protective tape) manufactured by LINTEC Corporation was used as the protective film. In the sample shown in FIG. 7(B), a laminated body constituted of the protective tape described above and a glass film having a thickness of 100 µm (ultrathin plate glass "G-Leaf" (registered trademark) manufactured by Nippon Electric Glass Co., Ltd.) (corresponding to protective film 10 according to this embodiment) was used as the protective film.

As a result of the evaluation, the warpage of the chip was 214 µm in the sample shown in FIG. 7(A), whereas the warpage of the chip was 56 µm in the sample shown in FIG. 7(B). Further, although not shown, the warpage amount of the chip at a time the thickness of the glass film is set to 50 µm was 111 µm.

It should be noted that as a reference example, the warpage amount of the chip at a time an aluminum film having a thickness of 30 µm is laminated in place of the glass film was 106 µm, and the warpage amount of the chip at a time an aluminum film having a thickness of 40 µm is laminated was 69 µm.

As described above, according to this embodiment, the warpage of the first semiconductor chip C 1 can be suppressed. Therefore, it is possible to stably produce a first semiconductor package P1 with a small warpage. Therefore, since the warpage of the first semiconductor package P1 or the semiconductor device 100 can be effectively suppressed also when mounting the second semiconductor package P2 on the first semiconductor package P1 and mounting the semiconductor device 100 on the control substrate 110, it is possible to prevent connection reliability of respective terminal portions from being lowered due to the warpage deformation.

Second Embodiment

Figure 8:
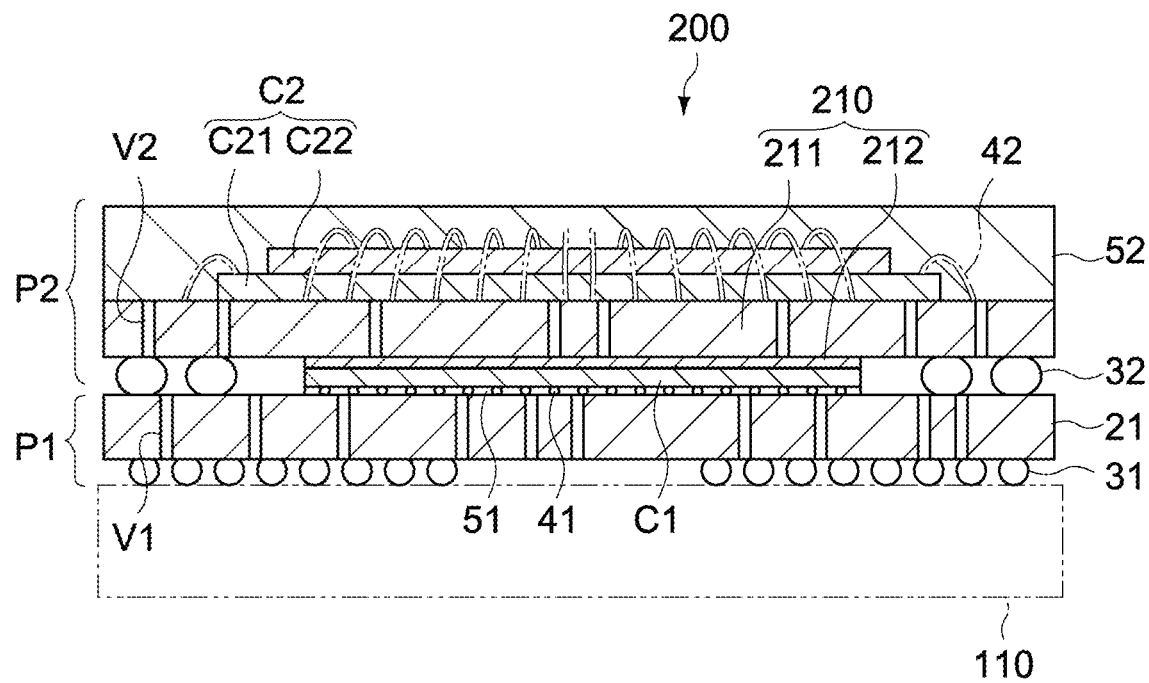
FIG. 8 A schematic side cross-sectional diagram showing a configuration of a semiconductor device according to a second embodiment of the present invention.

FIG. 8 is a schematic side cross-sectional diagram showing a configuration of a semiconductor device 200 according to another embodiment of the present invention. Hereinafter, configurations different from that of the first embodiment will be mainly described, configurations similar to those of the embodiment above will be denoted by similar symbols, and descriptions thereof will be omitted or simplified.

The semiconductor device 200 of this embodiment is common in that it includes a PoP structure as in the first embodiment but differs from the first embodiment in that a substrate 211 of a second wiring substrate 210 in the second semiconductor package P2 is formed of a vitreous material and configured as a protective layer of the first semiconductor chip C1.

In this embodiment, the second wiring substrate 210 includes the substrate 211, a wiring layer (via holes V2), and an adhesive layer 212. The substrate 211 is formed of a vitreous material. The wiring layer includes a wiring pattern provided on upper and lower surfaces of the substrate 211 and interlayer connection portions (via holes V2) provided inside the substrate 211, and electrically connects the first wiring substrate 21 and the second semiconductor chip C2 (C21, C22). The adhesive layer 212 is provided on the lower surface of the substrate 211 and bonded to the back surface (upper surface in figure) of the first semiconductor chip C1.

A thickness of the substrate 211 is not limited in particular as long as it can secure predetermined rigidity required for the wiring substrate, and a substrate having a thickness of 50 µm or more and 300 µm or less is used, for example. A form of the substrate 211 is not limited in particular, and it may be configured as a rigid sheet type having a high self-supporting property (independence) or may be configured as a film type having flexibility. Plate glass is typically used as the vitreous material forming the substrate 211, but a laminated body constituted of glass fibers, a glass powder sintered body, or the like may be used instead.

It should be noted that the substrate 211 may also be formed of a non-conductive inorganic material other than the vitreous material, such as a ceramic plate, for example.

The adhesive layer 212 is configured in a manner similar to that of the first embodiment (adhesive layer 12). The adhesive layer 212 functions as a sealing layer that tightly adheres the substrate 211 and the first semiconductor chip C1 to each other and shields the back surface of the first semiconductor chip C1 from ambient air.

Although the adhesive layer 212 shown in the figure is provided only in an area opposing the back surface of the first semiconductor chip C1, the present invention is not limited thereto, and the adhesive layer 212 may be provided across the entire lower surface of the substrate 211. In this case, openings may be formed at positions where the bumps 32 are provided in the adhesive layer 212, or the adhesive layer 212 itself may be constituted of a conductive adhesive layer or fixated of an anisotropic conductive material such as ACF (anisotropic conductive film)/ACP (anisotropic conductive paste).

In the semiconductor device 200 of this embodiment configured as described above, the second wiring substrate 210 includes the substrate 211 formed of a vitreous material and is bonded to the back surface of the first semiconductor chip C1 via the adhesive layer 212. Accordingly, since the warpage of the first semiconductor chip C1 can be effectively suppressed in the reflow mounting with respect to the control substrate 110, for example, a warpage deformation of the semiconductor device 200 is prevented from occurring, and connection reliability of each terminal portion can be improved.

Further, according to this embodiment, since the adhesive layer 212 of the second wiring substrate 210 is bonded to the back surface of the first semiconductor chip C1, the bond between the first semiconductor package P1 and the second semiconductor package P2 becomes stronger, and the connection reliability of the bumps 32 can be enhanced. In addition, since a clearance between the second wiring substrate 210 and the first semiconductor chip C1 becomes zero, it is possible to contribute to thinning of the semiconductor device 200.

Third Embodiment

Figure 9:
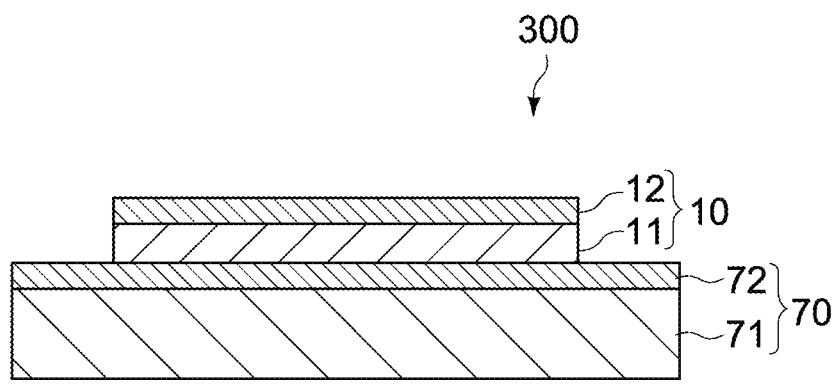
FIG. 9 A schematic cross-sectional diagram showing a configuration of a composite sheet according to a third embodiment of the present invention.

FIG. 9 is a schematic side cross-sectional diagram showing a configuration of a composite sheet 300 according to another embodiment of the present invention. Hereinafter, configurations different from that of the first embodiment will be mainly described, configurations similar to those of the embodiment above will be denoted by similar symbols, and descriptions thereof will be omitted or simplified.

As shown in FIG. 9, the composite sheet 300 according to this embodiment includes a cohesive sheet 70 in which a cohesive layer 72 is laminated on one surface of a base layer 71, and the protective film 10 laminated on the cohesive layer 72 side of the cohesive sheet 70. The protective film 10 is configured in a manner similar to that of the first embodiment and includes the protective layer 11 formed of a non-conductive inorganic material and the adhesive layer 12 provided on a surface of the protective layer 11 on the other side of the cohesive layer 74.

When processing a work, the composite sheet 300 is used for holding the work by being attached to the work and forming a protective film on the work or a workpiece obtained by processing the work. This protective film is constituted of the protective film 10, favorably the protective film 10 in which the adhesive layer 12 is cured.

The composite sheet 300 is used for holding a semiconductor wafer when carrying out dicing processing on the semiconductor wafer as a work and forming a protective film on a semiconductor chip obtained by the dicing as an example, but the present invention is limited to this. The cohesive sheet 70 of the composite sheet 300 in this case is normally called dicing sheet.

A constituent material of the base layer 71 of the cohesive sheet 70 is not limited in particular as long as it is suited for work processing such as dicing and expanding of a semiconductor wafer, for example, and a film mainly formed of a resin-based material (hereinafter, referred to as "resin film") is normally used.

Specific examples of the resin film include a polyethylene film such as a low-density polyethylene (LDPE) film, a linear low-density polyethylene (LLDPE) film, and a high-density polyethylene (HDPE) film, a polyolefin-based film such as a polypropylene film, a polybutene film, a polybutadiene film, a polymethylpentene film, an ethylene-norbornene copolymer film, and a norbornene resin film; an ethylene-based copolymer film such as an ethylene-vinyl acetate copolymer film, an ethylene-(meth) acrylic acid copolymer film, and an ethylene-(meth) acrylic acid ester copolymer film; a polyvinylchloride-based film such as a polyvinylchloride film and a vinyl chloride copolymer film; a polyester-based film such as a polyethylene terephthalate film and a polybutylene terephthalate film; a polyurethane film; a polyimide film; a polystyrene film; a polycarbonate film; a fluororesin film, and the like. Further, a crosslinked film of these and a modified film such as an ionomer film are also used. The base layer 71 may be a film including one type selected from these, or may be a laminated film obtained by combining two or more of these types. It should be noted that "(meth) acrylic acid" in this specification means both acrylic acid and methacrylic acid. The same applies to other similar terms.

Of those described above, from viewpoints of environmental safety, costs, and the like, polyolefin-based films are favorable. Of those, a polypropylene film having excellent heat resistance is favorable. With the polypropylene film, heat resistance can be imparted to the base layer 71 without impairing expansion suitability of the cohesive sheet 70 and chip pickup suitability. Since the base layer 71 has such heat resistance, a deflection of the cohesive sheet 70 can be suppressed also in a case where the protective film 10 is thermally cured in a state where the work is attached.

The resin film can be subjected to, if desired, surface processing on one surface or both surfaces thereof by an oxidation method, a roughening method, or the like, or primer processing for the purpose of improving adhesion with respect to the cohesive layer 72 laminated on the front surface thereof. Examples of the oxidation method include corona discharge processing, plasma discharge processing, chromium oxidation processing (wet type), flame processing, hot air processing, ozone, ultraviolet irradiation processing, and the like. Further, examples of the roughening method include a sandblast method, a thermal spraying method, and the like.

The thickness of the base layer 71 is not limited in particular as long as the base layer 71 can appropriately function in the respective processes that use the composite sheet 300. The thickness is favorably within the range of 20 to 450 μm, more favorably 25 to 400 μm, particularly favorably 50 to 350 μm.

The cohesive layer 72 may be formed of a non-energy ray-curable adhesive or may be formed of an energy ray-curable adhesive. As the non-energy ray-curable adhesive, those having a desired adhesive force and removability are favorable, and an acrylic-based adhesive, a rubber-based adhesive, a silicone-based adhesive, a urethane-based adhesive, a polyester-based adhesive, a polyvinyl ether-based adhesive, and the like can be used, for example. Of those, an acrylic-based adhesive that has high adhesion with respect to the protective film 10 and is capable of effectively suppressing dropping of a work or a workpiece in a dicing process or the like is favorable.

On the other hand, since the adhesive force of the energy ray-curable adhesive is lowered by energy ray irradiation, the work or workpiece can be easily separated from the cohesive sheet 70 by irradiating energy rays when wishing to separate them.

The thickness of the cohesive layer 72 is not limited in particular as long as the cohesive layer 72 can appropriately function in the respective processes that use the composite sheet 300. Specifically, the thickness is favorably 1 to 50 μm, more favorably 2 to 30 μm, further favorably 3 to 20 μm.

Heretofore, the embodiments of the present invention have been described. However, the present invention is not limited to the embodiments described above and can of course be variously modified.

For example, although a semiconductor (Si) chip has been taken as an example of the semiconductor element in the embodiments described above, other semiconductor bare chip components formed of GaAs (gallium arsenide) or the like may be used, or a package component such as CSP (Chip Size Package) may be used.

Furthermore, in the first embodiment, the adhesive layer 12 of the protective film 10 may also be formed of a material including a non-conductive inorganic material such as a vitreous material. Accordingly, rigidity (elastic modulus) of the entire protective film 10 can be enhanced, and thus a warpage of the first semiconductor chip C1 can be further suppressed. In addition, it is also possible to form the protective film 10 by the adhesive layer 12 alone and thus realize thinning of the protective film.

REFERENCE SIGNS LIST 10, 10F protective film
11 protective layer
12, 212 adhesive layer
13 release sheet
14 print layer
21 first wiring substrate
22, 210 second wiring substrate
100, 200 semiconductor device
211 substrate
300 composite sheet
C1 first semiconductor chip
C2 second semiconductor chip
P1 first semiconductor package
P2 second semiconductor package
T dicing tape
W semiconductor wafer

The invention claimed is:

1. A semiconductor protective film, comprising:
   a protective layer formed of a non-conductive inorganic material;
   an adhesive layer provided on a first surface of the protective layer; and
   a print layer on the protective layer,
   wherein the protective layer is a vitreous material layer and is transparent to a laser beam,
   wherein the print layer is either provided between the adhesive layer and the first surface of the protective layer or provided on a second surface of the protective layer different from the first surface of the protective layer, and
   wherein the print layer is formed by at least a part of the protective layer or the adhesive layer, and the print layer is marked by the laser beam.

2. The semiconductor protective film according to claim 1, wherein
   the non-conductive inorganic material includes at least a vitreous material.

3. The semiconductor protective film according to claim 2, wherein
   the protective layer is formed of plate glass.

4. The semiconductor protective film according to claim 1, wherein
   the protective layer has a thickness of 10 μm or more and 300 μm or less.

5. A semiconductor device, comprising:
   a wiring substrate;
   a semiconductor element flip-chip mounted on the wiring substrate; and
   a protective film including a protective layer formed of a non-conductive inorganic material, an adhesive layer that is provided on a first surface of the protective layer and bonded to a back surface of the semiconductor element, and a print layer on the protective layer,
   wherein the protective layer is a vitreous material layer and is transparent to a laser beam,
   wherein the print layer is either provided between the adhesive layer and the first surface of the protective layer or provided on a second surface of the protective layer different from the first surface of the protective layer, and
   wherein the print layer is formed by at least a part of the protective layer or the adhesive layer, and the print layer is marked by the laser beam.

6. The semiconductor device according to claim 5, wherein
   the protective layer is formed of plate glass.

7. The semiconductor device according to claim 5 wherein
   the protective layer has a thickness of 10 μm or more and 300 μm or less.

8. The semiconductor device according to claim 5, further comprising
   a semiconductor package component electrically connected to the wiring substrate,
   wherein the semiconductor element is arranged between the wiring substrate and the semiconductor package component.

* * * * *